(12) United States Patent
Park et al.

(10) Patent No.: US 12,342,659 B2
(45) Date of Patent: Jun. 24, 2025

(54) PHOSPHOR COATINGS FOR MICRO LIGHT-EMITTING DIODE (LED) DISPLAYS

(71) Applicant: GM GLOBAL TECHNOLOGY OPERATIONS LLC, Detroit, MI (US)

(72) Inventors: Jonglee Park, Troy, MI (US); Susan Carol Ellis, Hampton (CA)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 497 days.

(21) Appl. No.: 17/866,718

(22) Filed: Jul. 18, 2022

(65) Prior Publication Data

US 2024/0021587 A1    Jan. 18, 2024

(51) Int. Cl.
| | |
|---|---|
| *H10H 20/01* | (2025.01) |
| *H01L 25/075* | (2006.01) |
| *H10H 20/851* | (2025.01) |
| *H10H 20/854* | (2025.01) |

(52) U.S. Cl.
CPC ..... *H10H 20/0361* (2025.01); *H01L 25/0753* (2013.01); *H10H 20/8512* (2025.01); *H10H 20/854* (2025.01); *H10H 20/0362* (2025.01)

(58) Field of Classification Search
CPC ... H01L 25/0753; H01L 25/10; H10D 30/509; H10D 62/054; H10D 62/177; H10F 77/331; H10F 77/40; H10F 77/45; H10F 77/50; H10H 20/01; H10H 20/0361; H10H 20/0362; H10H 20/8512; H10H 29/0361; H10H 29/0362; H10H 29/8512
See application file for complete search history.

(56) References Cited

U.S. PATENT DOCUMENTS

2015/0221831 A1* 8/2015 Kim ................. G02F 1/133605
257/98

\* cited by examiner

*Primary Examiner* — Cheung Lee
(74) *Attorney, Agent, or Firm* — CANTOR COLBURN LLP

(57) ABSTRACT

Aspects of the disclosure include light-emitting diodes (LEDs) formed without phosphor deformation during the lamination process. An exemplary method can include forming one or more LEDs on a backplane and forming a protective layer on the backplane. The protective layer can be patterned to define one or more trenches exposing sidewalls of a respective one LED of the one or more LEDs and a surface of the backplane. Each trench can be filled with a color-shifting coating. The method includes laminating the one or more LEDs, the backplane, the protective layer, and the color-shifting coating between one or more inner reinforcing layers and one or more outer layers to define a display.

18 Claims, 5 Drawing Sheets

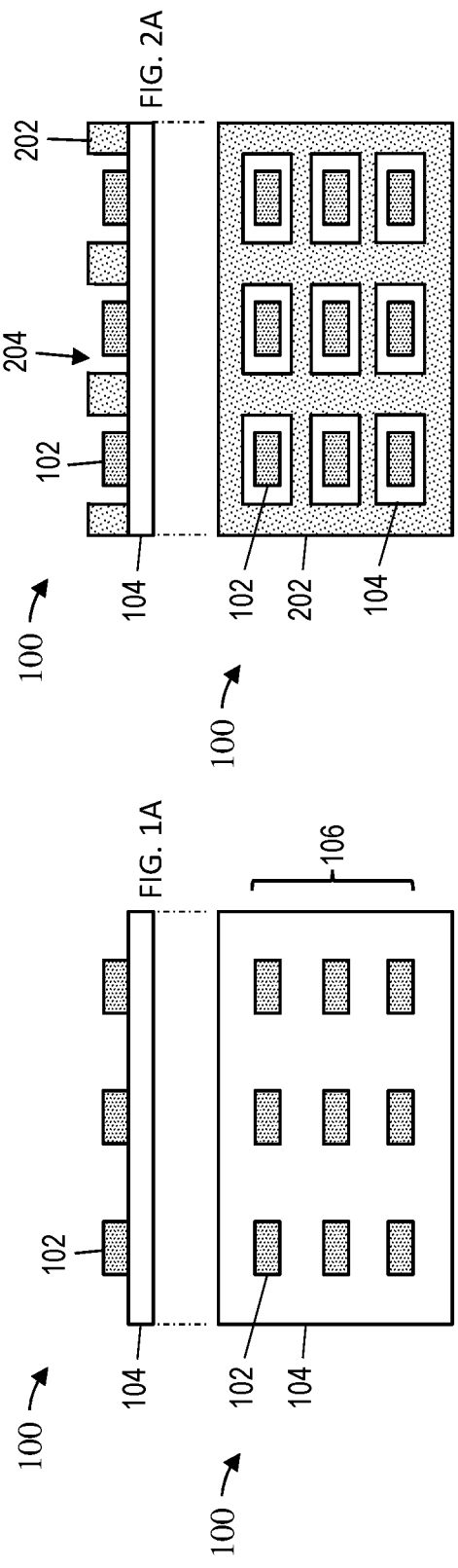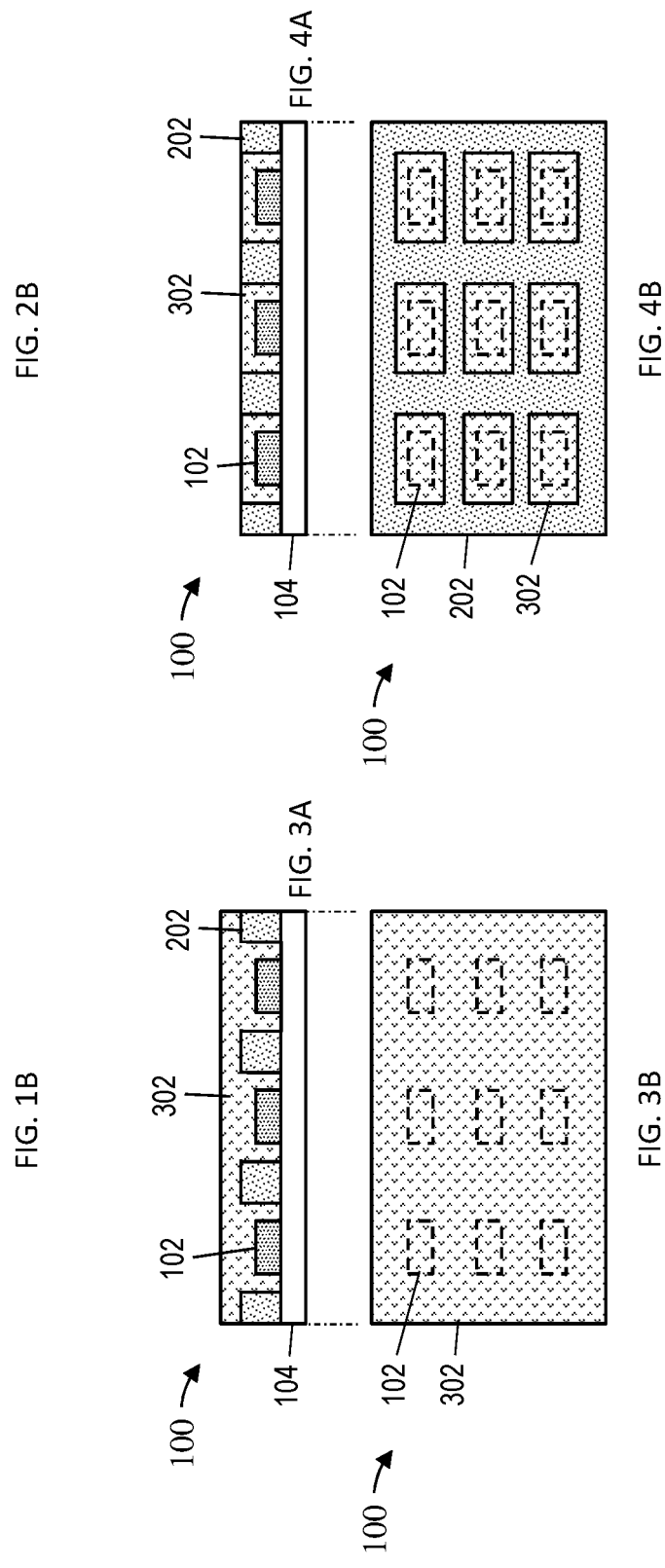

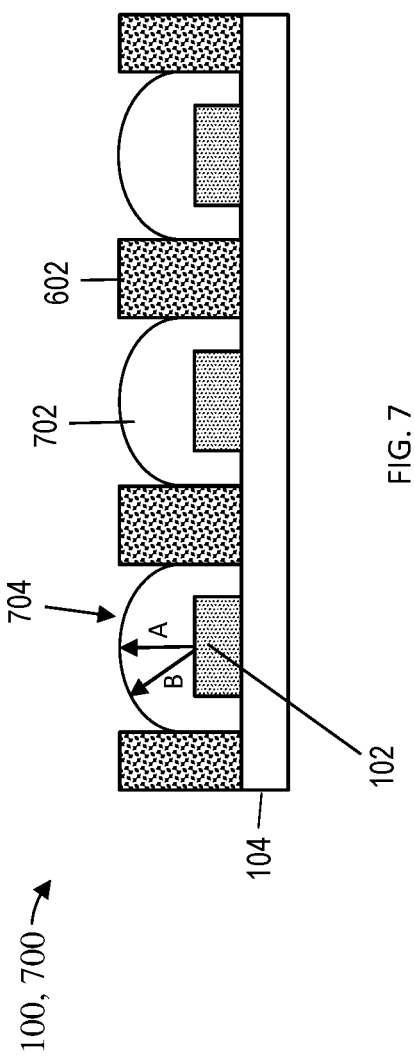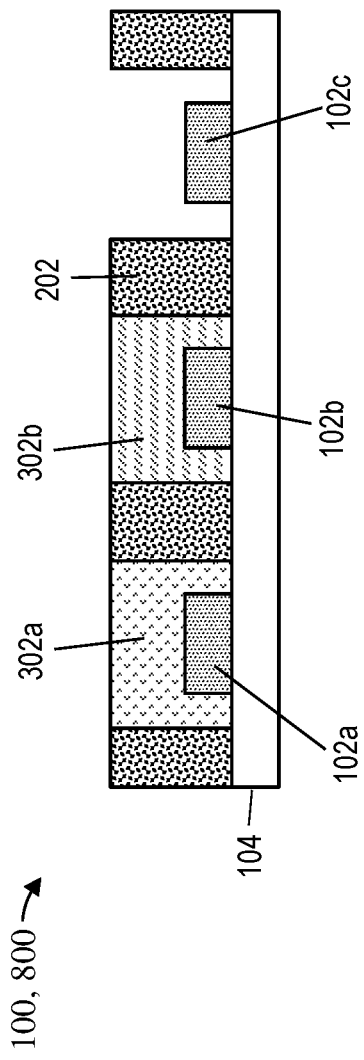

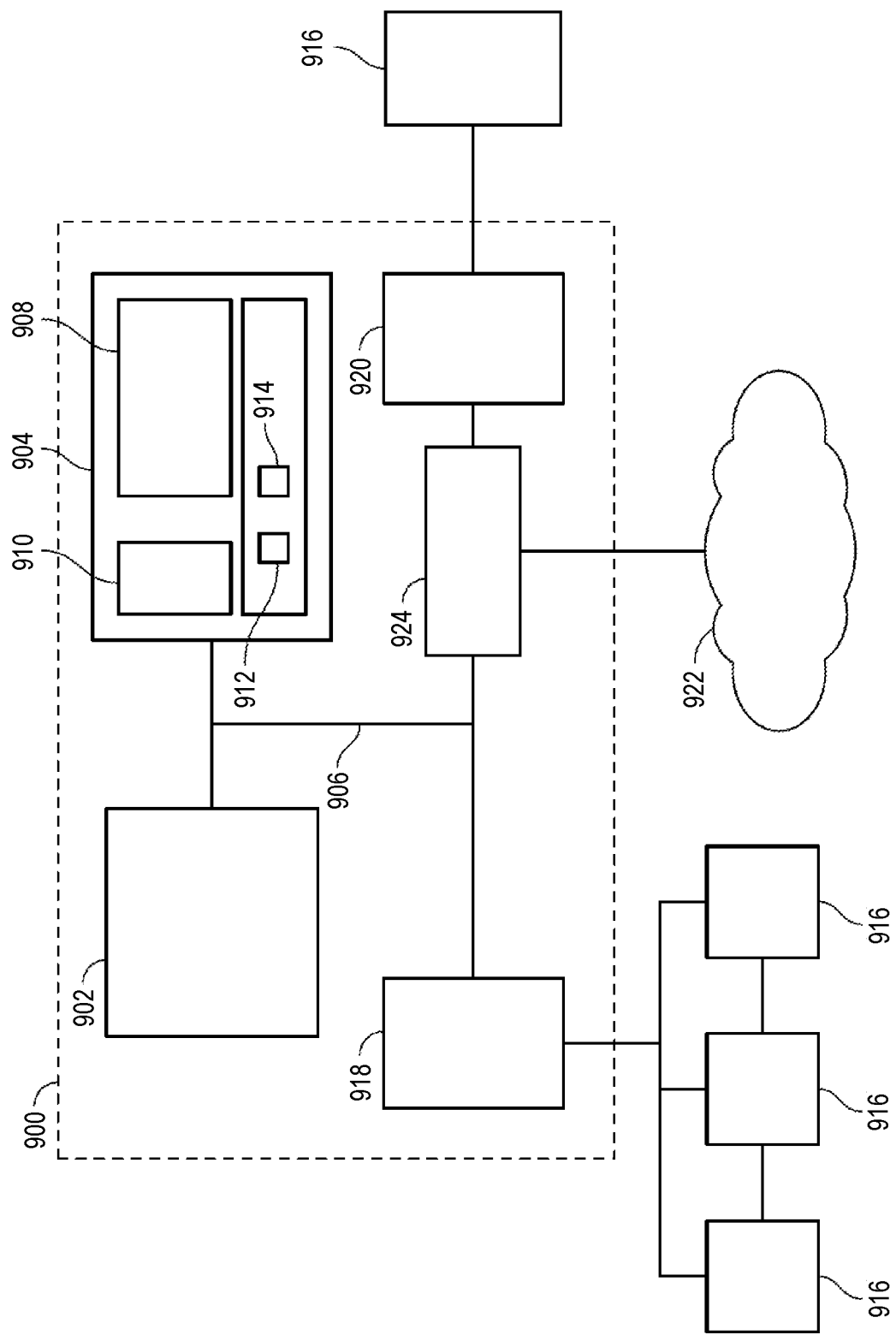

PHOSPHOR COATINGS FOR MICRO LIGHT-EMITTING DIODE (LED) DISPLAYS

INTRODUCTION

The subject disclosure relates to display technologies, and particularly to phosphor coatings for micro light-emitting diode (LED) displays and smart glass applications.

LED-based displays generally leverage an active layer interposed between two doped layers (e.g., an n-type semiconductor layer and a p-type semiconductor layer), and the application of a voltage between the two doped layers to generate light. Voltage causes electrons and holes to be injected into the active layer, which recombine within the active layer to release photons. When compared to traditional incandescent bulbs, LEDs can be driven at relatively low voltages while emitting lower levels of heat, providing comparatively high energy efficiencies. LEDs can be manufactured in a range of display and screen types, such as, for example, in head up displays (HUDs), in-plane displays (e.g., an in-plane communication device laminated in or on a vehicle window to communicate with users inside or outside the vehicle), smart glass, and general device displays.

Early LED-based displays were somewhat simple devices configured to display a limited variety of static images, signs, symbols, and/or messages as needed. LED technology has rapidly evolved, however, and now leverages a dense array of micro-LEDs to drive sophisticated multipixel displays. Micro-LED based in-plane displays can be monochrome or multi-colored displays, depending on the underlying architecture, and are usually fabricated by laminating a micro-LED layer (i.e., the active or emitting layer) between inner reinforcing layers (e.g., polyvinyl butyral (PVB) films) and outer glass layers. The micro-LED layer, the PVB films, and the glass layers are typically heat-sealed under pressure to create the final laminated structure.

SUMMARY

In one exemplary embodiment, a method includes forming light-emitting diodes (LEDs) with minimal (or eliminated) phosphor deformation during the lamination process. The method can include forming one or more LEDs on a backplane and forming a protective layer on the backplane. The protective layer can be patterned to define one or more trenches exposing sidewalls of a respective one LED of the one or more LEDs and a surface of the backplane. Each trench can be filled with a color-shifting coating. The method includes laminating the one or more LEDs, the backplane, the protective layer, and the color-shifting coating between one or more inner reinforcing layers and one or more outer layers to define a display.

In some embodiments, the one or more LEDs are formed to a first height and the protective layer is formed to a second height greater than the first height. In some embodiments, forming the protective layer includes progressively depositing a protective material on the backplane by spraying the protective material through a patterned mask to the second height.

In addition to one or more of the features described herein, filling the trench with the color-shifting coating can include depositing the color-shifting coating over the one or more LEDs, the protective layer, and the backplane until an overburden is formed above a surface of the protective layer. Filling the trench with the color-shifting coating can further include removing the overburden of the color-shifting coating to expose the surface of the protective layer. The overburden can be removed by planarizing the color-shifting coating to a surface of the protective layer.

In another embodiment, the color-shifting coating can include at least one of red phosphors, yellow phosphors, and green phosphors. The one or more inner reinforcing layers can each include a polyvinyl butyral (PVB) film. The one or more outer layers can each include glass.

In some embodiments, the protective layer is dyed to match a color of the color-shifting coating.

In another exemplary embodiment an LED display includes one or more LEDs on a backplane, a protective layer on the backplane, a color-shifting coating, one or more inner reinforcing layers, and one or more outer layers. The protective layer can be patterned to define one or more trenches, each trench exposing sidewalls of a respective one LED of the one or more LEDs and a surface of the backplane. The color-shifting coating can fill the trench.

In some embodiments, the one or more LEDs, the backplane, the protective layer, and the color-shifting coating are laminated between the one or more inner reinforcing layers and the one or more outer layers.

In still other embodiments, the one or more LEDs are formed to a first height and the protective layer is formed to a second height greater than the first height.

In some embodiments, the protective layer includes at least one of silicon and epoxy. In some embodiments of the invention, the one or more LEDs are formed in an array of N rows and M columns.

In yet other embodiments, the one or more LEDs, the backplane, the protective layer, and the color-shifting coating together define a micro-LED layer having a thickness of 0.3 mm to 0.7 mm.

In some embodiments, the color-shifting coating is planarized to a surface of the protective layer.

In some embodiments, the color-shifting coating includes at least one of red phosphors, yellow phosphors, and green phosphors. In some embodiments, the one or more inner reinforcing layers each include a PVB film. In some embodiments, the one or more outer layers each include glass.

In still other embodiments, the protective layer is dyed to match a color of the color-shifting coating.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which:

FIG. 1A depicts a cross-sectional view of a micro-LED display formed according to one or more embodiments;

FIG. 1B illustrates a top-down view of the micro-LED display shown in FIG. 1A.

FIG. 2A depicts a cross-sectional view of the micro-LED display shown in FIG. 1A after forming a protective layer on a backplane in accordance with one or more embodiments;

FIG. 2B illustrates a top-down view of the micro-LED display shown in FIG. 2A.

FIG. 3A depicts a cross-sectional view of the micro-LED display shown in FIG. 1A after forming a color-shifting coating in accordance with one or more embodiments;

FIG. 3B illustrates a top-down view of the micro-LED display shown in FIG. 3A.

FIG. 4A depicts a cross-sectional view of the micro-LED display shown in FIG. 1A after removing a portion of the color-shifting coating in accordance with one or more embodiments;

FIG. 4B illustrates a top-down view of the micro-LED display shown in FIG. 3A.

FIG. 7 depicts a cross-sectional view of a micro-LED display having equal light paths in accordance with one or more embodiments;

FIG. 8 depicts a cross-sectional view of a full color micro-LED display in accordance with one or more embodiments; and FIG. 9 is a computer system according to one or more embodiments;

DETAILED DESCRIPTION

Figure 5:
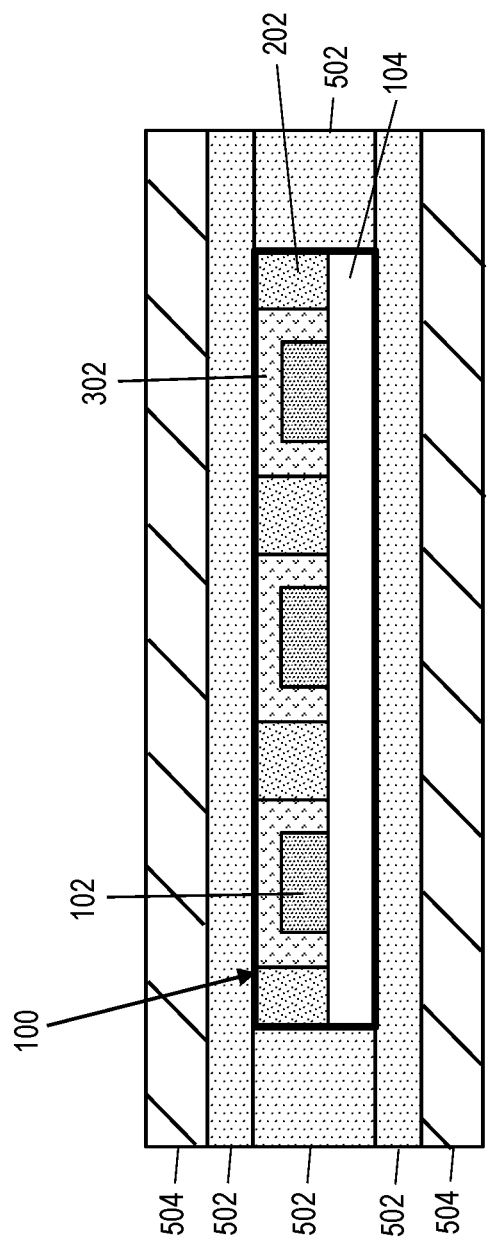
FIG. 5 illustrates a cross-sectional view of the micro-LED display shown in FIG. 4A after lamination in accordance with one or more embodiments.

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The continued development of sophisticated head up displays (HUDs), smart glass applications, in-plane displays, and general device displays is necessary to meet the ever-increasing demands and expectations of consumers, particularly in the competitive automotive industry. To enhance the driver experience, improved displays are being developed that can be seamlessly integrated within any of a vehicle's glass panels (e.g., front windshield, side mirrors, etc.). Micro-LED in-plane displays, for example, can be laminated within the glass itself to provide transparent or partially transparent viewing surfaces.

Micro-LED in-plane displays typically rely on color-shifting coatings to convert the emitted color of the underlying LEDs to a target color (i.e., the visible color). For example, blue light emitting micro-LEDs can be coated with yellow phosphors to shift the blue light to white light. In another example, blue light emitting micro-LEDs can be coated with red phosphors to shift the blue light to red light. Other LED color-phosphor color combinations are possible. Phosphor layers are typically installed on LEDs by coating the surface of the emitting layer of LEDs with phosphor particles.

Challenges remain, however, in the development and manufacture of phosphor-based micro-LED displays. One such challenge is phosphor deformation. Phosphor layers deform due to the high pressures involved in the lamination process used to incorporate the LEDs within the glass panel. In particular, phosphor deformation has been observed under autoclave/pre-press pressures for phosphor coatings with and without encapsulation. Phosphor deformation can result in light color shifting. For example, deformed yellow phosphor loses its effectiveness to color shift blue light emitted from an LED to white light. Unfortunately, the degree of phosphor deformation varies due to a range of factors (exact pressures, lamination timings, layer thicknesses, etc.), and consequently, the degree of color shifting in phosphor-based micro-LED displays can be somewhat unpredictable.

This disclosure introduces a way to prevent phosphor deformation during the lamination process of phosphor-based micro-LED displays. In some embodiments, delamination is wholly or partially mitigated by incorporating a protective layer that maintains the phosphor shape on the micro-LED backplane during the lamination process. The protective layer can be patterned around the micro-LED layer prior to lamination.

Advantageously, phosphor-based micro-LED displays constructed in accordance with one or more embodiments offer several advantages. For example, resultant multicolor micro-LED displays can provide a wider color gamut. For monochrome micro-LED displays, more accurate target colors can be achieved. Other advantages are possible. For example, controlling the protective layer thickness allows for the design of displays having consistent and relatively thicker phosphor layer thicknesses, resulting in a more uniform color emission. In some embodiments, the protective layer is patterned to reduce the overall amount of phosphor particles in the laminate without sacrificing the concentration of phosphor particles in the active region adjacent to and immediately above the micro-LEDs. In this manner, the amount of phosphor particles in "remote" regions (i.e., those regions between the LEDs which do not contribute to shifting the color of the observable light from the device, or whose contributions are below some predetermined threshold) is minimized or eliminated. In other words, a smaller amount of total phosphor particles can provide robust color conversion at lower cost. In still other embodiments, a homogeneous unlit display appearance can be achieved by matching the color of the protective layer to the phosphor color.

FIG. 1A illustrates a cross-sectional view of a micro-LED display 100 formed according to one or more embodiments. FIG. 1B illustrates a top-down view of the micro-LED display 100 shown in FIG. 1A.

As shown in FIG. 1A, the micro-LED display 100 includes one or more LED(s) 102 formed on a surface of a backplane 104 (also referred to as a substrate). The micro-LED display 100 is shown having a particular number (here, nine) and arrangement of LEDs for ease of discussion and illustration only. It should be understood, however, that the number, size, configuration, orientation, centerline-to-centerline pitch, etc., of the LEDs 102 can vary as required for a given display application. As shown in FIG. 1B, in some embodiments, the LEDs 102 are configured into N rows and M columns to define an N×M array 106 (also referred to as a grid or bank configuration).

The LEDs 102 and backplane 104 can be formed from a range of known suitable material(s), such as, for example, semiconductor materials (e.g., silicon, gallium nitride, indium gallium nitride, etc.) and sapphire, depending on the desired emission color of the respective LED. In some embodiments, the LEDs 102 and backplane 104 include several stacked layers, such as an indium gallium nitride/gallium nitride (InGaN/Gan) stack formed on a silicon or sapphire substrate to produce blue and green devices (not separately shown). The backplane 104 can include electrical connections (not separately shown) configured to individually control each of the LEDs 102 in the array 106 using electrical signals (i.e., by passing a voltage to a respective LED).

FIG. 2A illustrates a cross-sectional view of the micro-LED display 100 shown in FIG. 1A after forming a protective layer 202 on the backplane 104 in accordance with one or more embodiments. FIG. 2B illustrates a top-down view of the micro-LED display 100 shown in FIG. 2A.

The protective layer 202 can be formed from materials such as silicon and epoxy, although any suitable material is within the contemplated scope of the disclosure. In some embodiments, the protective layer 202 is formed using transparent materials (e.g., clear resin epoxy, etc.). Transparent materials are well-suited to applications such as an in-plane display in or on glass where transparency is required or desired. Alternatively, for applications that do not require transparency (e.g., general displays), the protective layer 202 can be colored to match the color of a color-shifting coating, as discussed in more detail with respect to FIG. 6. The protective layer 202 can be formed to any desired thickness, such as, for example, a thickness of 10 microns to several inches.

As shown in FIG. 2B, the protective layer 202 can be patterned onto the surface of the backplane 104 to define one or more trenches 204 around each of the LEDs 102 (i.e., sidewalls of the LEDs 102 are free of the protective layer 202). In other words, the protective layer 202 can be patterned such that portions of the backplane 104 are exposed. The protective layer 202 can be patterned onto the backplane 104 using known processes, such as, for example, via a silk screen process. In a silk screen the protective layer 202 is progressively formed by spraying material through a patterned mask to deposit the protective layer 202 to the desired thickness. Other deposition processes are possible and are within the contemplated scope of the disclosure.

FIG. 3A illustrates a cross-sectional view of the micro-LED display 100 shown in FIG. 2A after forming a color-shifting coating 302 in accordance with one or more embodiments. FIG. 3B illustrates a top-down view of the micro-LED display 100 shown in FIG. 3A. Observe that the LEDs 102 in FIG. 3B are shown via projection only, as the LEDs 102 are below the color-shifting coating 302.

As shown in FIG. 3A, the color-shifting coating 302 can be formed over the LEDs 102, the protective layer 202, and the backplane 104. In some embodiments, the color-shifting coating 302 fills the one or more trenches 204 around each of the LEDs 102. In other words, the color-shifting coating 302 can be formed directly on a surface of the backplane 104.

In some embodiments, the color-shifting coating 302 is made from one or more phosphors (e.g., red phosphors, yellow phosphors, green phosphors, etc.), although the materials selected for the color-shifting coating 302 are not meant to be particularly limited. For example, the color-shifting coating 302 can alternatively, or additionally, be made of quantum dot materials. Phosphors are materials which emit visible light when exposed to radiation from a deep blue, ultra-violet, or electron beam source (i.e., an underlying LED or other light source). By tuning the phosphor composition and structure, the spectral content of the emitted light can be shifted to provide a range of colors. For example, known phosphors can shift the emission from a blue LED to provide red, green, yellow, blue, and white light. Other colors (e.g., purples, orange, etc.) can be created by mixing phosphors or by mixing shifted light from two or more LEDs.

FIG. 4A illustrates a cross-sectional view of the micro-LED display 100 shown in FIG. 3A after removing a portion of the color-shifting coating 302 in accordance with one or more embodiments. FIG. 4B illustrates a top-down view of the micro-LED display 100 shown in FIG. 4A. Observe that the LEDs 102 in FIG. 4B are shown via projection only, as the LEDs 102 are below the color-shifting coating 302.

As shown in FIG. 4A, portions of the color-shifting coating 302 can be removed to expose a surface of the protective layer 202. In some embodiments, the color-shifting coating 302 can be confined to the one or more trenches 204. The manner chosen to remove portions of the color-shifting coating 302 is not meant to be particularly limited. In some embodiments, the color-shifting coating 302 is planarized to a surface of the protective layer 202 using, for example, chemical-mechanical planarization. In some embodiments of the invention, the protective layer 202 serves as an etch stop during the removal process. In other embodiments, portions of the color-shifting coating 302 are removed selective to the protective layer 202. The color-shifting coating 302 can be selectively removed (i.e., patterned) using, for example, a wet etch, a dry etch, or a combination of wet and/or dry etches.

The partially fabricated micro-LED display 100 is ready for lamination after completion of the process shown in FIGS. 1A to 4B. Lamination is discussed in greater detail with respect to FIG. 5. The process shown in FIGS. 1A to 4B can be modified without departing from the intended scope of the disclosure, so long as the resultant structure includes one or more LEDs, a protective layer, and a color-shifting coating confined to a trench(s) adjacent to sidewalls of the LEDs. For example, the process shown in FIGS. 3A and 3B can be optional steps, as, alternatively, the color-shifting coating 302 can be selectively deposited directly into the one or more trenches 204 (following the steps depicted in FIG. 2A) via a mask (not separately shown) until the color-shifting coating 302 is coplanar to a top surface of the protective layer 202. In other embodiments, the thickness of the protective layer 202 can be arbitrarily increased, resulting in an increase in the thickness of the color-shifting coating 302 (due, e.g., to filling the trenches 204 to match the height of the protective layer 202). Advantageously, increasing the thickness of the protective layer 202 (and, consequently, the color-shifting coating 302) increases an amount of phosphors between the LEDs 102 and an observer, resulting in a fuller, more robust color.

FIG. 5 illustrates a cross-sectional view of the micro-LED display 100 shown in FIG. 4A after lamination in accordance with one or more embodiments. As shown in FIG. 5, the partially fabricated micro-LED display 100 can be completed by laminating the incoming structure between one or more inner reinforcing layers 502 and one or more outer layers 504.

The material composition of the one or more inner reinforcing layers 502 and the one or more outer layers 504 is not meant to be particularly limited and will vary depend on the needs of a respective application (e.g., desired structural, thermal, and optical properties, etc.). In some embodiments, for example, the inner reinforcing layers 502 can be made of polyvinyl butyral (PVB) films and the outer layers 504 can be glass layers. PVB-glass laminates are well-suited to in-plane and smart displays and can provide a transparent or semi-transparent display as desired. Similarly, the thickness of each of the one or more inner reinforcing layers 502 and the one or more outer layers 504 is not meant to be particularly limited and will vary depend on the needs of a respective application (e.g., desired structural, thermal, and optical properties, etc.). In some embodiments, for example, the one or more inner reinforcing layers 502 and the one or more outer layers 504 are formed to a thickness of 1 to 100 microns, or more (e.g., layers can be several inches thick if desired).

The incoming, partially fabricated micro-LED display 100 (i.e., the LEDs 102, backplane 104, protective layer 202, and color-shifting coating 302, configured and arranged as shown in FIGS. 4A and 4B) can be laminated between the one or more inner reinforcing layers 502 and the one or more outer layers 504 using known processes. In some embodiments, the micro-LED display 100, inner reinforcing layers 502 (e.g., PVB films), and outer layers 504 (e.g., glass) are heat-sealed under pressure to laminate the final structure. In some embodiments, the final structure is an in-plane display incorporated on or within a glass panel (e.g., of a vehicle, structure, etc., not separately shown).

In some embodiments, lamination involves heating (e.g., at temperatures greater than 100 degrees Celsius) and quenching in an autoclave under a pressure of 10 kg-f/cm$_2$ or higher, although other lamination conditions (temperatures, pressures, etc.) are within the contemplated scope of the disclosure. In some embodiments, the micro-LED display 100 can be formed to a total thickness of 0.1 mm to 10 mm or greater, e.g., 0.3 mm, 0.7 mm, 2 mm, etc., although other thicknesses are within the contemplated scope of the disclosure. In some embodiments, the micro-LED display 100 post-lamination can have a total thickness of 0.1 mm to a thickness of several inches (e.g., 2 inches, 4 inches, etc.), depending on the application.

Figure 6:
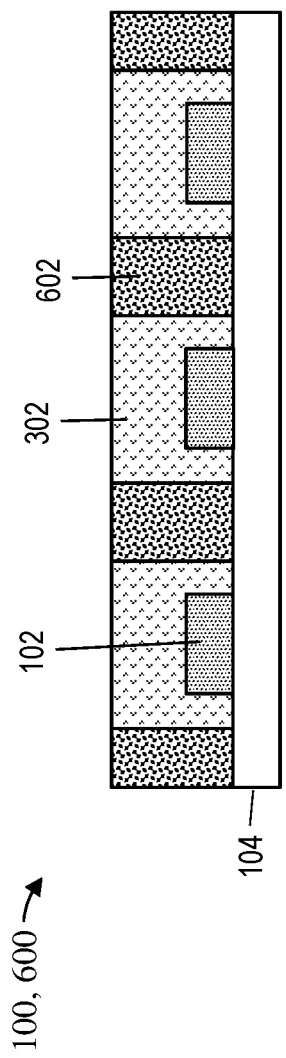
FIG. 6 depicts a cross-sectional view of a micro-LED display having a color-matched protective layer in accordance with one or more embodiments.

FIG. 6 illustrates a cross-sectional view of a micro-LED display 100 formed in accordance with one or more embodiments. As shown in FIG. 6, the micro-LED display 100 can include LEDs 102, a backplane 104, and a color-shifting coating 302, configured and arranged in a similar manner as discussed previously (see, e.g., FIGS. 1A to 5). In contrast to the previous embodiments of the micro-LED display 100, however, the micro-LED display 100 of FIG. 6 includes a color-matched protective layer 602. Color-matched embodiments of the micro-LED display 100 can be alternatively referred to as the micro-LED display 600.

The color-matched protective layer 602 can be formed in a similar manner and with similar materials as the protective layer 202 discussed previously with respect to FIGS. 1A to 5, except that the color-matched protective layer 602 is colored, dyed, or otherwise altered to match a color of the color-shifting coating 302. For example, the color-matched protective layer 602 can be colored red to match red phosphors (or green to match green phosphors, yellow for yellow phosphors, etc.). Color-matched protective layers provide a homogenous unlit appearance and are well-suited to display applications that do not require transparent or semi-transparent mediums. The micro-LED display 100 can be incorporated within a protected display structure via lamination between one or more inner reinforcing layers and one or more outer layers in accordance with one or more embodiments (not separately shown).

FIG. 7 illustrates a cross-sectional view of another embodiment of a micro-LED display 100 having equal light paths in accordance with one or more embodiments. As shown in FIG. 7, the micro-LED display 100 can include LEDs 102, a backplane 104, and a color-matched protective layer 602, configured and arranged in a similar manner as discussed previously with respect to the micro-LED display 600 (see, e.g., FIG. 6). The micro-LED display 100, however, includes a color-shifting coating 702 which has been constructed, in contrast to the color-shifting coating 302, to ensure equal light paths from the LEDs 102. Embodiments of the micro-LED display 100 having equal light paths can be alternatively referred to as the micro-LED display 700.

In some embodiments, the color-shifting coating 302 includes a surface 704 which is curved such that light paths A and B are the same. In other words, the distance, as measured from a centerline of the LEDs 102 to the surface 704, is the same (i.e., A=B). In this manner, the color of light emitted through the color-shifting coating 702 of the micro-LED display 700 will be the same across a range of viewing angles.

FIG. 8 illustrates a cross-sectional view of a full color micro-LED display 100 formed in accordance with one or more embodiments. As shown in FIG. 8, the full color micro-LED display 100 can include LEDs 102 (here, LEDs 102a, 102b, and 102c), a backplane 104, a protective layer 202 (which can, in some embodiments, be color matched as discussed previously), and a color-shifting coating 302 (here, color-shifting coatings 302a, 302b), configured and arranged in a similar manner as discussed previously with respect to the micro-LED display 100 (see, e.g., FIG. 6).

The full color micro-LED display 100, however, includes different combinations of LED and color-shifting materials to enable a full color display. For example, in some embodiments, the LEDs 102a, 102b, and 102c are blue LEDs, while the color-shifting coating 302a includes red phosphor, the color-shifting coating 302b includes green phosphor, and the LED 102c is exposed without a color-shifting coating. In this manner, light from the LED 102a appears red, light from the LED 102b appears green, and light from the LED 102c appears blue (i.e., unaltered). In some embodiments, the LEDs 102a, 102b, 102c can be differently colored LEDs to provide further color shifting. The particular combination of LED colors and color-shifting coating materials is not meant to be particular limited, and the provided examples are meant to be merely illustrative of the general concept. In some embodiments, the full color micro-LED display 100 serves as an RGB pixel in a multi-pixel display (not separately shown). Full color embodiments of the micro-LED display 100 can be alternatively referred to as the micro-LED display 800.

FIG. 9 illustrates aspects of an embodiment of a computer system 900 that can perform various aspects of embodiments described herein. In some embodiments, the computer system 900 can be incorporated within or in combination with a micro-LED display (e.g., the micro-LED display 100). The computer system 900 includes at least one processing device 902, which generally includes one or more processors for performing a variety of functions, such as, for example, controlling voltages to one or more of the LEDs 102 of the micro-LED display 100. More specifically, the computer system 900 can include the logic necessary to direct the backplane 104 to control the array 106 (i.e., to activate or deactivate the individual LEDs 102 of the micro-LED display 100).

Components of the computer system 900 include the processing device 902 (such as one or more processors or processing units), a system memory 904, and a bus 906 that couples various system components including the system memory 904 to the processing device 902. The system memory 904 may include a variety of computer system readable media. Such media can be any available media that is accessible by the processing device 902, and includes both volatile and non-volatile media, and removable and non-removable media.

For example, the system memory 904 includes a non-volatile memory 908 such as a hard drive, and may also include a volatile memory 910, such as random access memory (RAM) and/or cache memory. The computer system 900 can further include other removable/non-removable, volatile/non-volatile computer system storage media.

The system memory 904 can include at least one program product having a set (e.g., at least one) of program modules that are configured to carry out functions of the embodiments described herein. For example, the system memory 904 stores various program modules that generally carry out the functions and/or methodologies of embodiments described herein. A module or modules 912, 914 may be included to perform functions related to control of the micro-LED display 100, such as, for example, determining a target image based on in-vehicle data and directing the micro-LED display 100 (via, e.g., the backplane 104) to drive one or more of the LEDs 102 to create the target image. The computer system 900 is not so limited, as other modules may be included depending on the desired functionality of the respective displays. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality. For example, the module(s) can be configured via software, hardware, and/or firmware to cause a display (the micro-LED display 100) to display an image, such as, for example, a vehicle status or a driver and/or passenger communication.

The processing device 902 can also be configured to communicate with one or more external devices 916 such as, for example, a keyboard, a pointing device, and/or any devices (e.g., a network card, a modem, vehicle ECUs, etc.) that enable the processing device 902 to communicate with one or more other computing devices. Communication with various devices can occur via Input/Output (I/O) interfaces 918 and 920.

The processing device 902 may also communicate with one or more networks 922 such as a local area network (LAN), a general wide area network (WAN), a bus network and/or a public network (e.g., the Internet) via a network adapter 924. In some embodiments, the network adapter 924 is or includes an optical network adaptor for communication over an optical network. It should be understood that although not shown, other hardware and/or software components may be used in conjunction with the computer system 900. Examples include, but are not limited to, microcode, device drivers, redundant processing units, external disk drive arrays, RAID systems, and data archival storage systems, etc.

Figure 10:
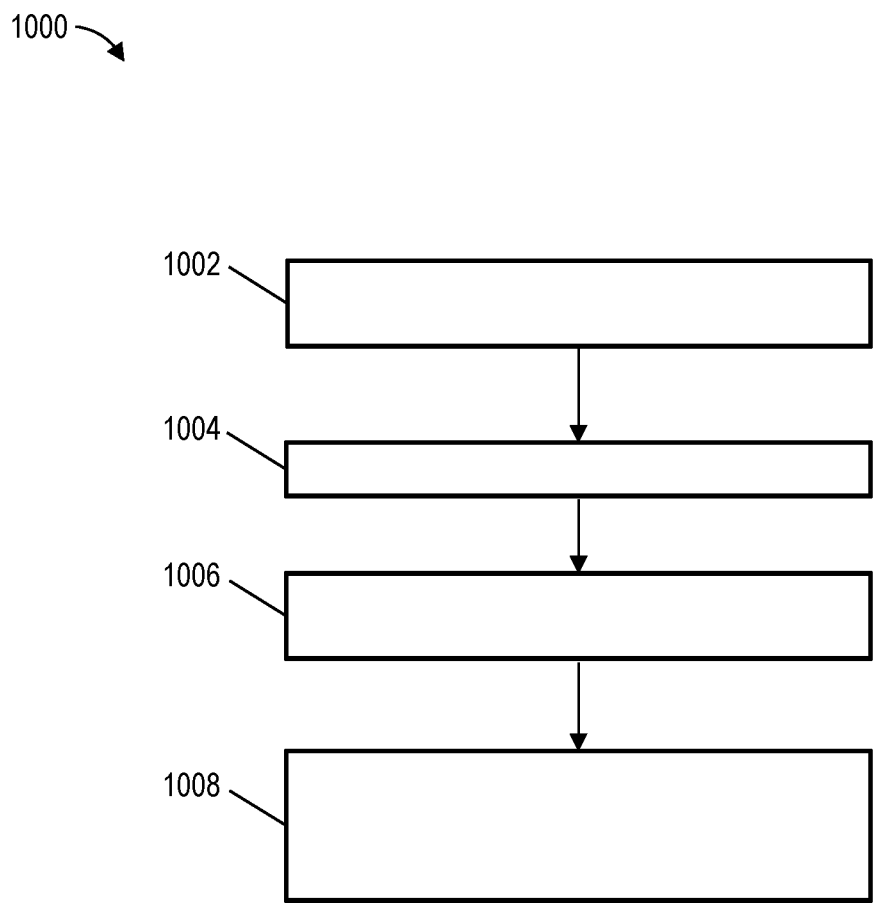
FIG. 10 is a flowchart in accordance with one or more embodiments.

Referring now to FIG. 10, a flowchart 1000 for forming an LED display is generally shown according to an embodiment. The flowchart 1000 is described in reference to FIGS. 1A to 9 and may include additional steps not depicted in FIG. 10. Although depicted in a particular order, the blocks depicted in FIG. 10 can be rearranged, subdivided, and/or combined.

At block 1002, one or more LEDs are formed on a backplane. In some embodiments, the one or more LEDs are formed to a first height and the protective layer is formed to a second height greater than the first height.

At block 1004, a protective layer is formed on the backplane. The protective layer can be patterned to define one or more trenches. In some embodiments, each trench exposes sidewalls of a respective one LED of the one or more LEDs and a surface of the backplane. In some embodiments, forming the protective layer includes progressively depositing a protective material on the backplane by spraying the protective material through a patterned mask to the second height.

At block 1006, each trench is filled with a color-shifting coating. In some embodiments, filling the trench with the color-shifting coating includes depositing the color-shifting coating over the one or more LEDs, the protective layer, and the backplane until an overburden is formed above a surface of the protective layer. In some embodiments, the overburden of the color-shifting coating is removed to expose the surface of the protective layer. In some embodiments, removing the overburden includes planarizing the color-shifting coating to a surface of the protective layer.

In some embodiments, the color-shifting coating comprises at least one of red phosphors, yellow phosphors, and green phosphors. In some embodiments, the protective layer is dyed or otherwise colored to match a color of the color-shifting coating (i.e., to match a phosphor color).

At block 1008, the one or more LEDs, the backplane, the protective layer, and the color-shifting coating are laminated between one or more inner reinforcing layers and one or more outer layers to define a display. In some embodiments, the one or more inner reinforcing layers each include a PVB film. In some embodiments, the one or more outer layers each include glass.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method comprising:
    forming one or more light-emitting diodes (LEDs) on a backplane;
    forming a protective layer on the backplane, the protective layer patterned to define one or more trenches, each trench exposing sidewalls of a respective one LED of the one or more LEDs and a surface of the backplane;
    filling the trench with a color-shifting coating by depositing the color-shifting coating over the one or more LEDs, the protective layer, and the backplane until an overburden is formed above a surface of the protective layer and removing the overburden of the color-shifting coating to expose the surface of the protective layer; and
    laminating the one or more LEDs, the backplane, the protective layer, and the color-shifting coating between one or more inner reinforcing layers and one or more outer layers to define a display.

2. The method of claim 1, wherein the one or more LEDs are formed to a first height and the protective layer is formed to a second height greater than the first height.

3. The method of claim 2, wherein forming the protective layer comprises progressively depositing a protective material on the backplane by spraying the protective material through a patterned mask to the second height.

4. The method of claim 1, wherein removing the overburden comprises planarizing the color-shifting coating to a surface of the protective layer.

5. The method of claim 1, wherein the color-shifting coating comprises at least one of red phosphors, yellow phosphors, and green phosphors.

6. The method of claim 1, wherein the one or more inner reinforcing layers each comprise a polyvinyl butyral (PVB) film.

7. The method of claim 6, wherein the one or more outer layers each comprise glass.

8. The method of claim 1, further comprising dying the protective layer to match a color of the color-shifting coating.

9. A light-emitting diode (LED) display, the display comprising:
one or more light-emitting diodes (LEDs) on a backplane;
a protective layer on the backplane, the protective layer patterned to define one or more trenches, each trench exposing sidewalls of a respective one LED of the one or more LEDs and a surface of the backplane;
a color-shifting coating filling the trench;
one or more inner reinforcing layers; and
one or more outer layers;
wherein the one or more LEDs, the backplane, the protective layer, and the color-shifting coating are laminated between the one or more inner reinforcing layers and the one or more outer layers; and
wherein the protective layer is dyed to match a color of the color-shifting coating.

10. The display of claim 9, wherein the one or more LEDs are formed to a first height and the protective layer is formed to a second height greater than the first height.

11. The display of claim 9, wherein the protective layer comprises at least one of silicon and epoxy.

12. The display of claim 9, wherein the one or more LEDs are formed in an array of N rows and M columns.

13. The display of claim 9, wherein the one or more LEDs, the backplane, the protective layer, and the color-shifting coating together define a micro-LED layer having a thickness of 0.3 mm to 0.7 mm.

14. The display of claim 9, wherein the color-shifting coating is planarized to a surface of the protective layer.

15. The display of claim 9, wherein the color-shifting coating comprises at least one of red phosphors, yellow phosphors, and green phosphors.

16. The display of claim 9, wherein the one or more inner reinforcing layers each comprise a polyvinyl butyral (PVB) film.

17. The display of claim 16, wherein the one or more outer layers each comprise glass.

18. A light-emitting diode (LED) display, the display comprising:
one or more light-emitting diodes (LEDs) on a backplane;
a protective layer on the backplane, the protective layer patterned to define one or more trenches, each trench exposing sidewalls of a respective one LED of the one or more LEDs and a surface of the backplane;
a color-shifting coating filling the trench;
one or more inner reinforcing layers, each comprising a polyvinyl butyral (PVB) film; and
one or more outer layers;
wherein the one or more LEDs, the backplane, the protective layer, and the color-shifting coating are laminated between the one or more inner reinforcing layers and the one or more outer layers.

* * * * *